US008635261B2

(12) United States Patent
Tinker

(10) Patent No.: US 8,635,261 B2
(45) Date of Patent: *Jan. 21, 2014

(54) DECIMATION FILTER

(75) Inventor: Darrell Eugene Tinker, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 395 days.

This patent is subject to a terminal disclaimer.

(21) Appl. No.: 12/945,259

(22) Filed: Nov. 12, 2010

(65) Prior Publication Data

US 2011/0060783 A1   Mar. 10, 2011

Related U.S. Application Data

(62) Division of application No. 11/356,338, filed on Feb. 16, 2006, now Pat. No. 7,856,464.

(51) Int. Cl.
*G06F 17/17* (2006.01)
*H03M 7/00* (2006.01)

(52) U.S. Cl.
USPC ............................................ 708/313; 341/61

(58) Field of Classification Search
USPC ................. 708/290, 313; 341/61, 155
See application file for complete search history.

(56) References Cited

U.S. PATENT DOCUMENTS

| | | | |
|---|---|---|---|
| 4,181,822 A * | 1/1980 | Workman | 704/201 |
| 4,195,318 A * | 3/1980 | Price et al. | 360/39 |
| 4,539,707 A * | 9/1985 | Jacobs et al. | 455/47 |
| 4,625,126 A | 11/1986 | Tinker et al. | |
| 4,694,495 A * | 9/1987 | Schroeer | 381/15 |
| 4,999,798 A | 3/1991 | McCaslin et al. | |
| 5,185,609 A | 2/1993 | DeBord | |
| 5,559,513 A | 9/1996 | Rothermel et al. | |
| 5,617,344 A | 4/1997 | Young et al. | |
| 5,634,116 A | 5/1997 | Singer | |
| 5,638,010 A * | 6/1997 | Adams | 327/105 |
| 5,781,044 A * | 7/1998 | Riley et al. | 327/105 |
| 5,786,778 A * | 7/1998 | Adams et al. | 341/61 |
| 5,796,995 A | 8/1998 | Nasserbakht et al. | |
| 5,835,043 A * | 11/1998 | Tsuchida et al. | 341/143 |
| 5,892,468 A * | 4/1999 | Wilson et al. | 341/61 |
| 5,915,028 A | 6/1999 | Chahabadi | |
| 5,949,363 A | 9/1999 | Kosiak et al. | |
| 6,055,619 A | 4/2000 | North et al. | |
| 6,057,793 A | 5/2000 | Gong et al. | |
| 6,081,216 A * | 6/2000 | May | 341/143 |
| 6,163,787 A * | 12/2000 | Menkhoff | 708/313 |
| 6,175,269 B1 | 1/2001 | Gielis et al. | |
| 6,184,942 B1 | 2/2001 | Patel et al. | |
| 6,208,671 B1 | 3/2001 | Paulous et al. | |

(Continued)

OTHER PUBLICATIONS

Babic et al., Power efficient structure for conversion between arbitrary sampling rates, Signal Processing Letters, IEEE, vol. 12, No. 1, Jan. 2005, pp. 1-4.

(Continued)

*Primary Examiner* — Chat Do
*Assistant Examiner* — Matthew Sandifer
(74) *Attorney, Agent, or Firm* — Toler Law Group, PC

(57) ABSTRACT

A system includes a decimation module having an adjustable decimation rate and a filter module responsive to the decimation module. A digital phase lock loop is operable to control a decimation rate of the decimation module. The decimation module is a cascade integrator comb decimation module.

11 Claims, 7 Drawing Sheets

(56) References Cited

U.S. PATENT DOCUMENTS

| | | | |
|---|---|---|---|
| 6,211,924 B1 | 4/2001 | Patel et al. | |
| 6,215,423 B1* | 4/2001 | May et al. | 341/61 |
| 6,226,663 B1* | 5/2001 | Kodra | 708/552 |
| 6,310,653 B1 | 10/2001 | Malcolm, Jr. et al. | |
| 6,333,767 B1 | 12/2001 | Patel et al. | |
| 6,362,755 B1 | 3/2002 | Tinker | |
| 6,373,912 B1 | 4/2002 | Yu | |
| 6,480,233 B1 | 11/2002 | Limberg | |
| 6,512,555 B1 | 1/2003 | Patel et al. | |
| 6,523,147 B1 | 2/2003 | Kroeger et al. | |
| 6,526,101 B1 | 2/2003 | Patel et al. | |
| 6,584,145 B1 | 6/2003 | Camagna et al. | |
| 6,584,162 B1* | 6/2003 | Tinker | 375/355 |
| 6,694,026 B1 | 2/2004 | Green | |
| RE38,456 E | 3/2004 | Patel et al. | |
| 6,700,936 B1 | 3/2004 | Moss | |
| 6,701,140 B1 | 3/2004 | Stine | |
| 6,738,610 B1 | 5/2004 | Wildhagen | |
| 6,778,106 B2 | 8/2004 | Lenez et al. | |
| 6,801,028 B2 | 10/2004 | Kernahan et al. | |
| 6,996,200 B2* | 2/2006 | Schubert et al. | 375/355 |
| 7,061,409 B1* | 6/2006 | Jantti et al. | 341/61 |
| 7,071,773 B2 | 7/2006 | Kuhn et al. | |
| 7,079,657 B2 | 7/2006 | Wu et al. | |
| 7,102,548 B1 | 9/2006 | Wang et al. | |
| 7,106,224 B2 | 9/2006 | Knapp et al. | |
| 7,149,312 B1* | 12/2006 | Wildhagen | 381/2 |
| 7,180,349 B2 | 2/2007 | Leifso et al. | |
| 7,196,648 B1 | 3/2007 | Ding et al. | |
| 7,199,739 B2* | 4/2007 | May | 341/143 |
| 7,302,459 B2* | 11/2007 | Bossmeyer et al. | 708/313 |
| 2001/0036261 A1* | 11/2001 | Prendergast et al. | 379/398 |
| 2001/0040930 A1 | 11/2001 | Abbey | |
| 2002/0125948 A1* | 9/2002 | Haigh et al. | 330/151 |
| 2004/0032922 A1 | 2/2004 | Knapp et al. | |
| 2004/0075766 A1 | 4/2004 | Schoner | |
| 2004/0264614 A1 | 12/2004 | Tinker | |
| 2005/0160124 A1 | 7/2005 | Bisiaux | |
| 2005/0169394 A1* | 8/2005 | Jeong | 375/261 |
| 2006/0077300 A1 | 4/2006 | Cheon et al. | |
| 2006/0179095 A1 | 8/2006 | Lo Muzio et al. | |
| 2007/0027943 A1 | 2/2007 | Jensen et al. | |
| 2007/0035667 A1* | 2/2007 | Ying et al. | 348/738 |
| 2008/0144743 A1* | 6/2008 | Alderson et al. | 375/324 |
| 2008/0147762 A1* | 6/2008 | Alderson et al. | 708/313 |
| 2008/0317182 A1* | 12/2008 | Zhang et al. | 375/355 |

OTHER PUBLICATIONS

Babic et al., Flexible down-sampling using CIC filter with non-integer delay, IEEE International Symposium on Circuits and Systems, vol. 2, 2002, pp. 285-288.

Babic et al., Decimation by irrational factor using CIC filter and linear interpolation, IEEE International Conference on Acoustics, Speech, and Signal Processing—2001 Proceedings, vol. 6, 2001, pp. 3677-3680.

* cited by examiner

US 8,635,261 B2

DECIMATION FILTER

CLAIM OF PRIORITY

This application is a divisional patent application of, and claims priority from, U.S. patent application Ser. No. 11/356,338, filed on Feb. 16, 2006 and entitled "DECIMATION FILTER," which is hereby incorporated by reference in its entirety.

FIELD OF THE DISCLOSURE

The present disclosure is generally related to decimation filters.

BACKGROUND

Decimation filters may be used in a variety of applications, such as analog to digital conversion. A decimation filter typically filters a digital signal while reducing the sample rate of the digital signal by a particular predetermined decimation rate. However, some digital signals may have a sample rate that varies over time. In addition, it may be desirable in some applications to decimate the digital signal by different decimation rates at different times.

Accordingly, there is a need for an improved method and system of decimation filtering.

DETAILED DESCRIPTION OF THE DRAWINGS

A system and method for decimating a digital signal are disclosed. In a particular embodiment, a system includes a decimation module having an adjustable decimation rate and a filter module responsive to the decimation module. A digital phase lock loop is operable to control a decimation rate of the decimation module. The decimation module is a cascade integrator comb decimation module.

In another particular embodiment, a method includes receiving, at a cascade integrator comb (CIC) decimation filter, a control signal from a digital phase lock loop (PLL). In response to the control signal, a decimation rate of the CIC decimation filter is adjusted. The method further includes decimating a digital signal based on the decimation rate of the CIC decimation filter and providing the decimated digital signal to a filter module.

Figure 1:
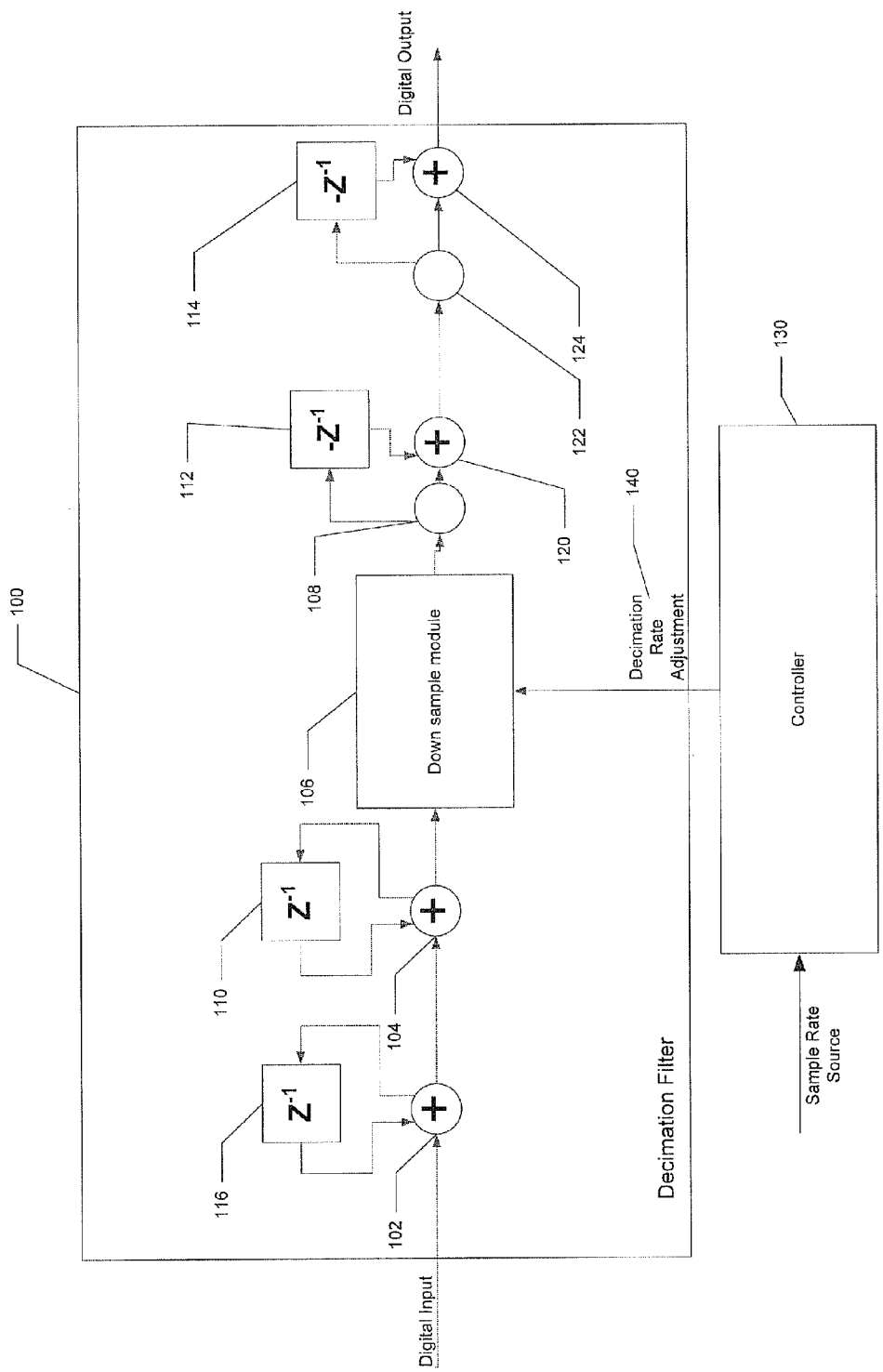
FIG. 1 is a block diagram of an illustrative embodiment of a digital decimation filter.

Referring to FIG. 1, a decimation filter 100 is illustrated. In a particular embodiment, the decimation filter 100 is a cascade integrator comb (CIC) decimation filter. The decimation filter 100 is connected to a controller 130. The controller 130 receives a sample rate source input and provides a decimation rate adjustment input to the decimation filter 100.

The decimation filter 100 includes a first adder 102, a second adder 104, a down sample module 106, a first node 108, a third adder 120, a second node 122, and a fourth adder 124. The variable rate CIC decimation filter 100 also includes a first delay element 116, a second delay element 110, a third delay element 112, and a fourth delay element 114.

The first adder 102 receives a digital input. The first adder 102 provides an output to the delay element 116, and is responsive to an output of the delay element 116. The second adder 104 is responsive to an output of the first adder 102. The second adder 104 is coupled to an input of the second delay element 110, and is responsive to an output of the delay element 110. The down sample module 106 is responsive to an output of the second adder 104. The down sample module 106 is controlled by the decimation rate adjustment signal 140 provided by the controller 130. The first node 108 is responsive to an output of the down sample module 106. The third delay element 112 is responsive to the first node 108. The third adder 120 is responsive to the first node 108 and is also responsive to an output of the third delay element 112. The second node 122 is responsive to an output of the third adder 120. The fourth delay element 114 is responsive to an output of the second node 122. The fourth adder 124 is responsive to an output of the second node 122, and is also responsive to an output of the fourth delay element 114. The fourth adder 124 provides a digital output for the decimation filter 100.

During operation, the decimation filter 100 receives a digital input at the first adder 102. The decimation filter 100 also receives a desired decimation rate via the decimation rate adjustment signal 140 from the controller 130. The decimation filter 100 filters the digital input and decimates the digital input at a particular decimation rate. The decimation rate is adjustable based on the desired decimation rate adjustment signal 140.

The controller 130 provides the decimation rate adjustment signal 140 based on the sample rate source input. The sample rate source input may be based on a measured sample rate of the digital input, on a measured difference between two clock signals, or other measurement. The sample rate source input may change over time. For example, if the sample rate source input is based on a measured difference between two clock signals, that difference may change over time because of changes in the clocks that produce the clock signals. By changing the decimation rate adjustment signal 140 based on the sample rate source input, the controller 130 can dynamically adapt the decimation rate of the decimation filter 100 to the changing sample rate source input.

The decimation filter 100 filters and decimates the digital input. The first adder 102 and the second adder 104 together with the delay elements 116 and 110 comprise an integrator stage responsive to the digital input. The first node 108, third adder 120, second node 122 and fourth adder 124 together with the third delay element 112 and the fourth delay element 114 comprise a differentiator stage that is responsive to the down sample module 106. The integrator stage and differentiator stage filter the digital input signal according to a particular filter response. The filter response may be changed by adding additional integrator stages together with corresponding differentiator stages.

The down sample module 106 is responsive to the integrator stage. The down sample module 106 has an adjustable decimation rate that is dynamically adjusted based on the decimation rate adjustment signal 140. In a particular embodiment, the decimation rate of the decimation filter 100 is adjusted substantially in real-time by changing the decimation rate adjustment signal 140. In another particular embodiment, the decimation rate adjustment 140 is adjusted at a first time by the controller 130 and is further adjusted at a second time that is less than 25 microseconds after the first time. By adjusting the decimation rate adjustment signal at different times, the decimation rate of the decimation filter 100 may be changed over time to adapt to changing system conditions. For example, the decimation rate of the decimation filter 100 may be changed over time to adapt to a changing system clock signal.

Further, the down sample module 106 provides an output including a plurality of samples. The decimation rate of the down sample module 106 may be adjusted by changing a time interval between a first of the plurality of samples and a second of the plurality of samples. The decimation rate of the down sample module 106 may be further adjusted at a second time by changing the time interval between the plurality of samples by a second time interval. The first time interval and the second time interval may be substantially equivalent.

In addition, the decimation rate of the down sample module 106 may be adjusted by adding a first offset to an input sample received at the down sample module 106. The first offset may be determined by multiplying an offset factor and an output of the first adder 102. The down sample rate of the down sample module may be represented by a digital word, and the offset factor may be limited with respect to a least significant bit of the down sample rate of the down sample module 106.

Figure 2:
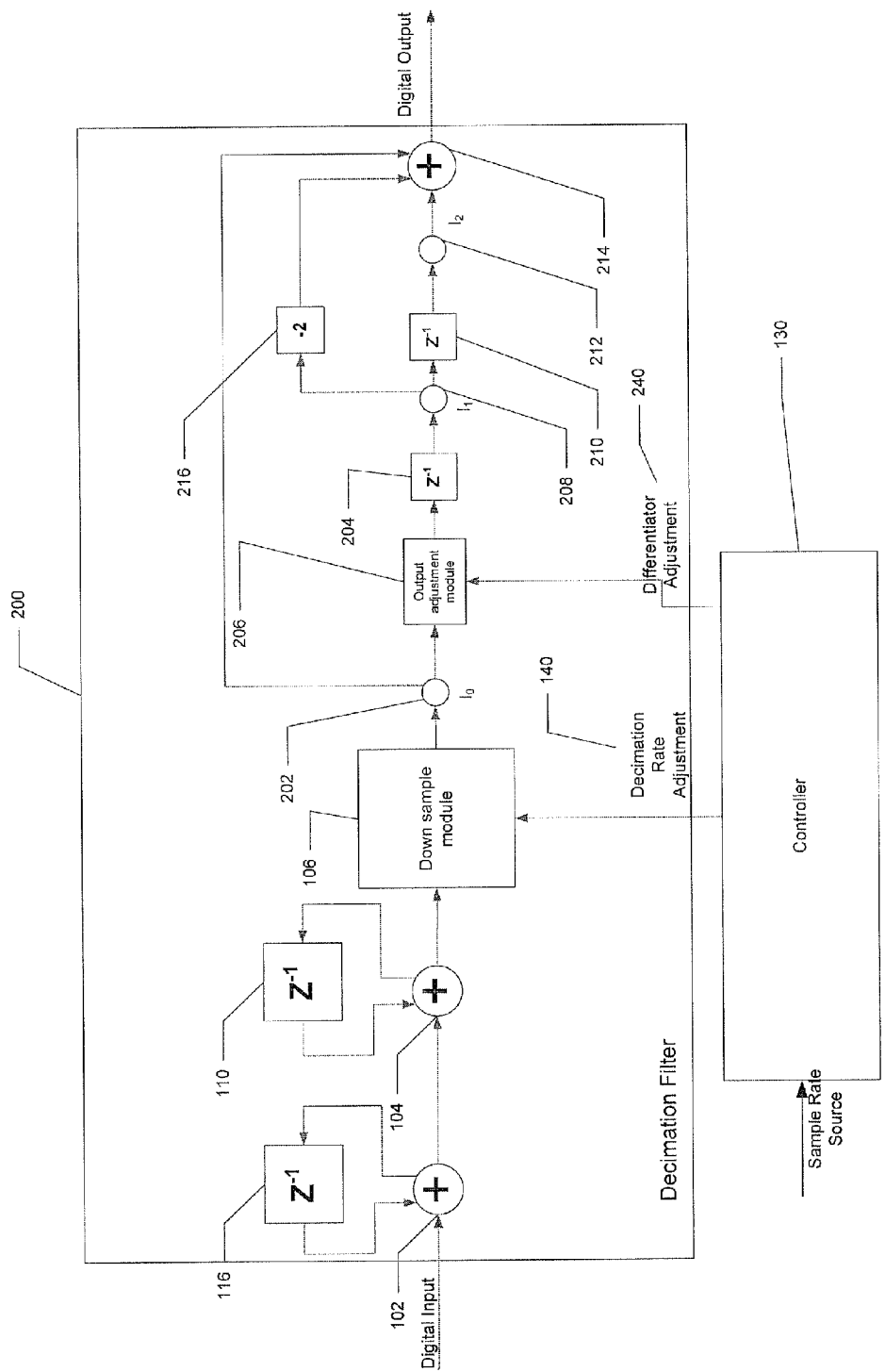
FIG. 2 is a block diagram of an alternative embodiment of the digital decimation filter of FIG. 1.

Referring to FIG. 2, an alternative embodiment of the digital decimation filter illustrated in FIG. 1 is shown. The digital decimation filter 200 of FIG. 2 includes a differentiation stage in a different configuration than the differentiation stage of the digital decimation filter 100 of FIG. 1. In particular, the digital decimation filter 200 includes a first node 202, a first delay element 204, and an output adjustment module 206. The digital decimation filter 200 also includes a second node 208, a second delay element 210, a third node 212, and an adder 214. The digital decimation filter also includes an adjustment factor 216.

The first node 202 is responsive to an output of the down sample module 106. The output adjustment module 206 is responsive to an output of the first node 202 and is controlled by the controller 130. The first delay element 204 is responsive to an output of the output adjustment module 206. The second node 208 is responsive to an output of the first delay element 204. The second delay element 210 is responsive to an output of the second node 208. The third node 212 is responsive to an output of the second delay element 210. The adjustment factor 216 is responsive to an output of the second node 208. The adder 214 is coupled to outputs of the adjustment factor 216, the first node 202, and the third node 212.

The down sample module provides an output sample at the first node 202, labeled "$I_0$." The sample value at the second node 208 is labeled "$I_1$." The sample value at the third node 212 is labeled "$I_2$."

During operation, the output value of the digital output may be expressed as:

$$I_0 - 2I_1 + I_2$$

The output adjustment module 206 may be controlled by the controller 130 to adjust the value of $I_1$ after adjustment of the downsample rate of the down sample module 106 in order to provide the appropriate digital output. In a particular embodiment, the values $I_0$, $I_1$, and $I_2$ are each stored in a register. The output adjustment module 206 may include an adder to add an adjustment value to the stored value of $I_0$.

As explained above with respect to FIG. 1, the down sample module 106 can be controlled by the controller 130. The down sample rate of the down sample module 106 is adjusted based on the decimation rate adjustment signal 140 provided by the controller 130. After the down sample rate has been adjusted, the value $I_0$ is provided by the down sample module 106. In a particular embodiment, the value of $I_0$ is based on a linear interpolation operation. Based on this value of $I_0$ the decimation filter 200 calculates a filter response according to the formula given above, and a digital output is provided.

After the decimation filter 200 provides a digital output, the values of $I_1$, and $I_2$ are adjusted to compensate for the change in the down sample rate. In a particular embodiment, the value $I_2$ is set to the value of $I_1$ and the value of $I_1$ is set to the value of $I_0$ plus or minus an adjustment factor. In a particular embodiment, the adjustment factor is based on the decimation rate adjustment signal 140. The value of $I_1$ is adjusted by the differentiator adjustment signal 240 provided by the controller 130. In another particular embodiment, the adjustment factor is based on a change in the value of the decimation rate adjustment signal 140 multiplied by an output of the adder 102. By adjusting the values of $I_1$ and $I_2$, the decimation filter 200 is prepared for subsequent adjustments to the decimation rate of the down sample module 106.

Figure 3:
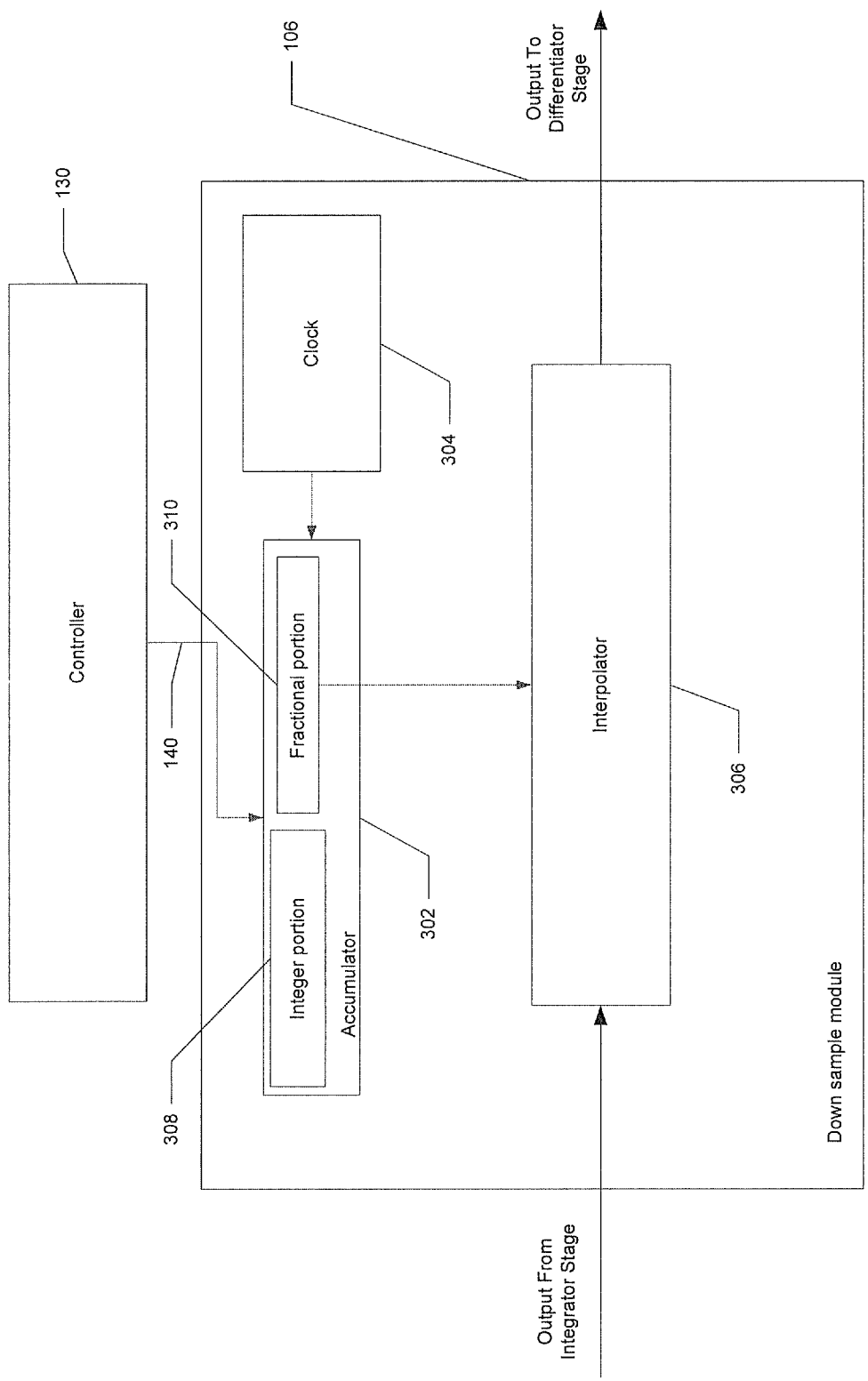
FIG. 3 is a block diagram of an exemplary embodiment of a down sample module that may be used in the digital decimation filter of FIG. 1 and FIG. 2.

Referring to FIG. 3, an exemplary embodiment of the down sample module of FIG. 2 is shown. The down sample module 106 is coupled to the controller 130. The controller 130 provides the decimation rate adjustment signal 140 to the down sample module. The down sample module 106 includes an accumulator 302, a clock 304, and an interpolator 306. The accumulator 302 stores a decimation interval including an integer portion 308 and a fractional portion 310. The interpolator 306 is responsive to the accumulator 302. The interpolator 306 receives an output from the integrator stage, such as the integrator stage illustrated in FIG. 2 and provides an output to a differentiator stage, such as the differentiator stage illustrated in FIG. 2. The accumulator 302 is responsive to the clock 304.

During operation, the accumulator 302 receives a decimation interval from the controller 130. The decimation interval includes an integer portion 308 and a fractional portion 310. The decimation interval is based on a dynamically determined decimation rate. The interpolator 306 is responsive to the accumulator 302 and receives a digital sample output from the integrator stage. The interpolator provides an output based on an interpolation of the digital sample to a differentiator stage. In a particular embodiment, the accumulator 302 decrements the integer portion 308 at a first clock rate based on the clock 304. When the integer portion 308 stored in the accumulator 302 reaches zero, the interpolator provides an output based on an interpolation of the input digital sample with respect to the fractional portion 310. By performing the interpolation operation, the down sample module is able to decimate at a non-integer rate. After the interpolator 306 provides the output, the controller 130 may provide adjustments to particular stages of the differentiator stage, such as the adjustments described above with respect to FIG. 2. In addition, the controller 130 may provide further adjustments to the contents of the accumulator 302 in order to provide for appropriate operation of the filter. In a particular embodiment, the controller 130 adds an adjustment factor to the accumulator to compensate for any adjustment in the decimation rate. In a particular embodiment, the adjustment factor is limited by a least significant bit of the down sample rate.

The controller 130 may control the amount of adjustment to the accumulator 208 to prevent error conditions. In a particular embodiment, the controller 130 does not provide an adjustment to the accumulator 208 when the value stored by the accumulator would be reduced below a predetermined threshold, such as zero.

Figure 4:
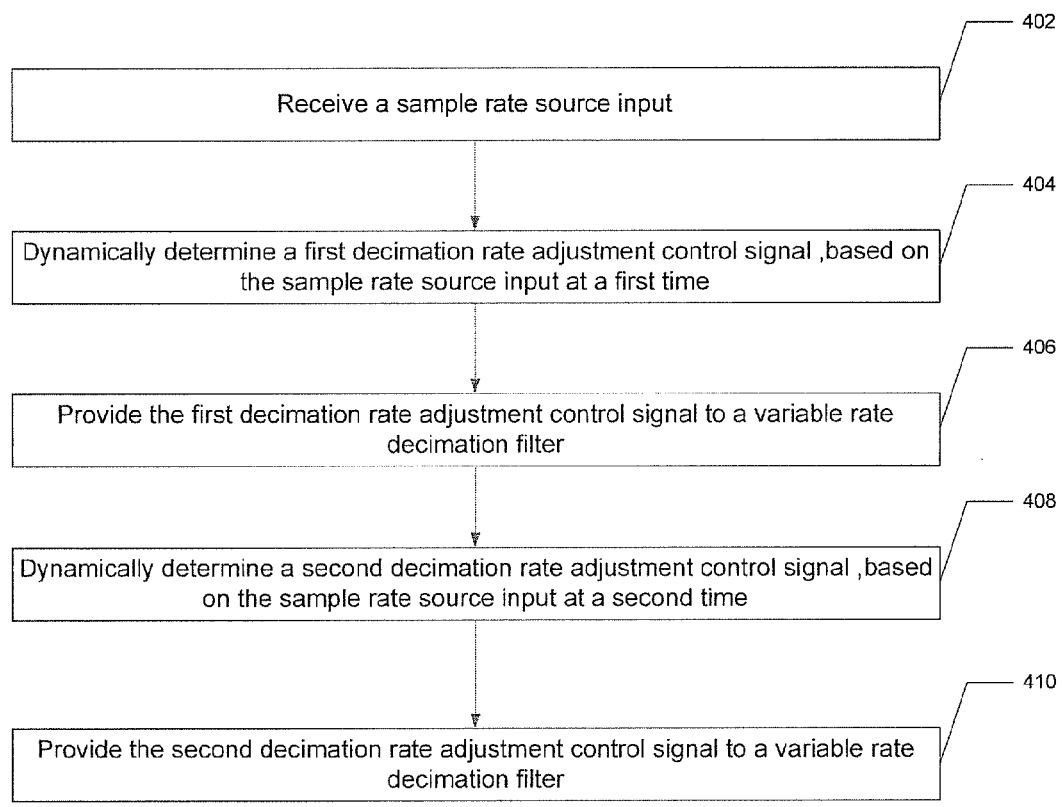
FIG. 4 is a flow chart of a method of controlling a decimation module.

Referring to FIG. 4, a method of adjusting a decimation rate is illustrated. At step 402 a sample rate source input is received. The sample rate source input may be provided by a digital phase lock loop or other device that measures a sample rate. Moving to step 404, a first decimation rate adjustment control signal is dynamically determined based on the sample rate source input at a first time period. Proceeding to step 406, the first decimation rate adjustment control signal is provided to a variable rate decimation filter. This decimation rate adjustment control signal may adjust the decimation rate of the variable rate decimation filter. In a particular embodiment the first decimation rate adjustment control signal includes an offset based on the sample rate source input. In another particular embodiment, the first decimation rate adjustment control signal is provided by an output of a digital phase lock loop. In still another particular embodiment the first decimation rate adjustment control signal represents a non-integer adjustment.

At step 408, a second decimation rate adjustment control signal is dynamically determined based on the sample rate source input at a second time period. This second decimation rate adjustment control signal may represent a different adjustment amount than the first decimation rate adjustment control signal. Proceeding to step 410, the second decimation rate adjustment control signal is provided to a variable rate decimation filter. By providing different decimation rate adjustments at different times, the decimation rate of a variable decimation rate filter may be changed over time to adapt to a changing sample rate source input.

Figure 5:
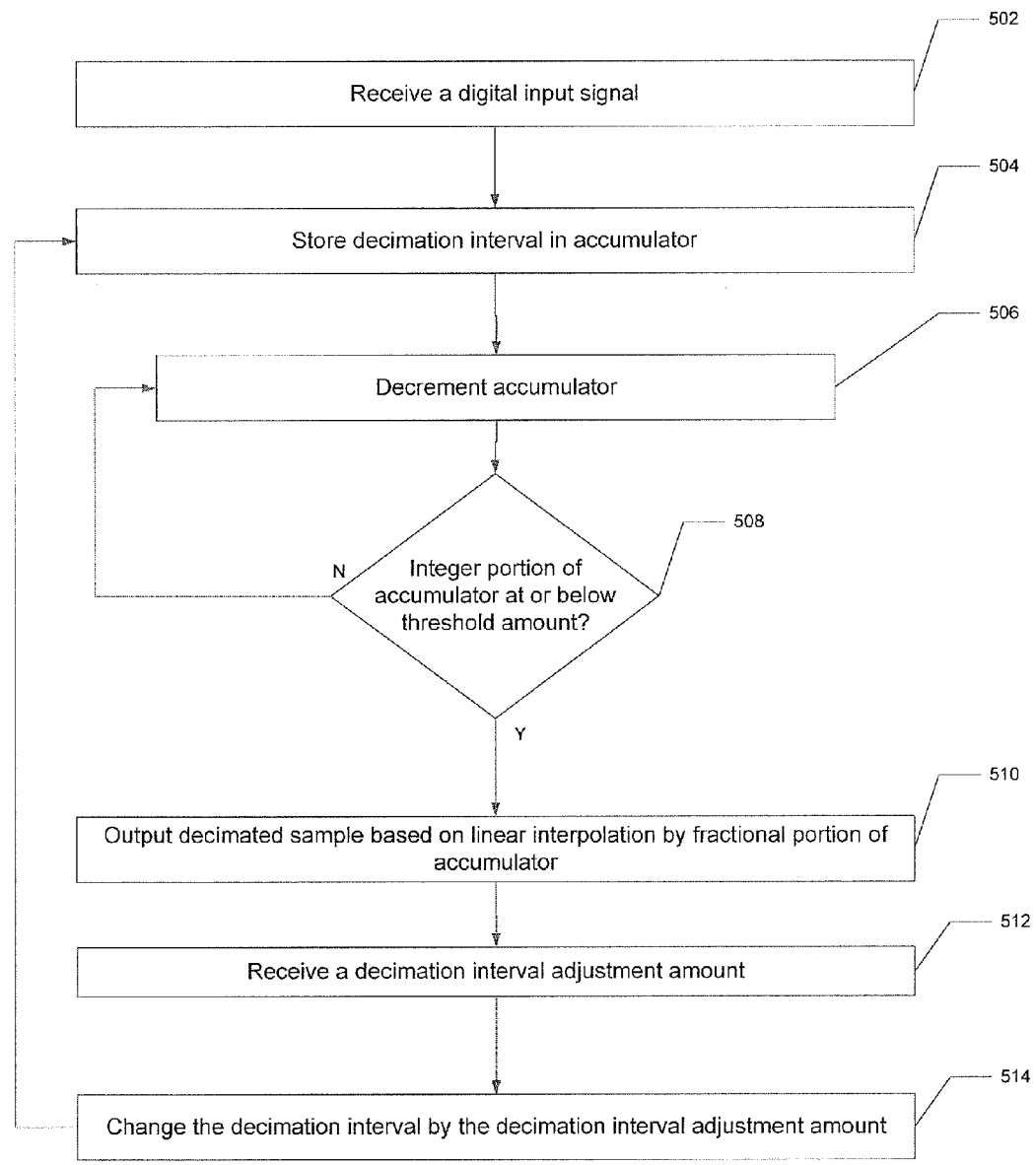
FIG. 5 is a flow chart of a method of decimating a digital signal.

Referring to FIG. 5, a method of decimating a digital input signal with a variable rate decimation filter is illustrated. At step 502 a digital input signal is received. Proceeding to step 504, a decimation interval is stored in an accumulator. This decimation interval may be determined based on a particular desired decimation rate. At step 506, the accumulator is decremented at a particular clock rate. Moving to decision step 508, it is determined whether the integer portion of the accumulator is at or below a threshold amount. In a particular embodiment, the threshold amount is zero. If the integer portion of the accumulator is not at or below the threshold amount, the method returns to step 506. If the integer portion of the accumulator is at the threshold amount, the method moves to step 510 and outputs a decimated sample based on a linear interpolation by a fractional portion of the accumulator. By computing the output sample based on the linear interpolation, non-integer decimation rates may be achieved.

The method proceeds to step 512 and a decimation interval adjustment amount is received. The decimation interval adjustment amount may be provided by a control module based on a sample rate source input. Moving to step 514, the decimation interval is changed by the decimation interval adjustment amount. The method then returns to step 504 to store the new decimation interval in the accumulator.

Figure 6:
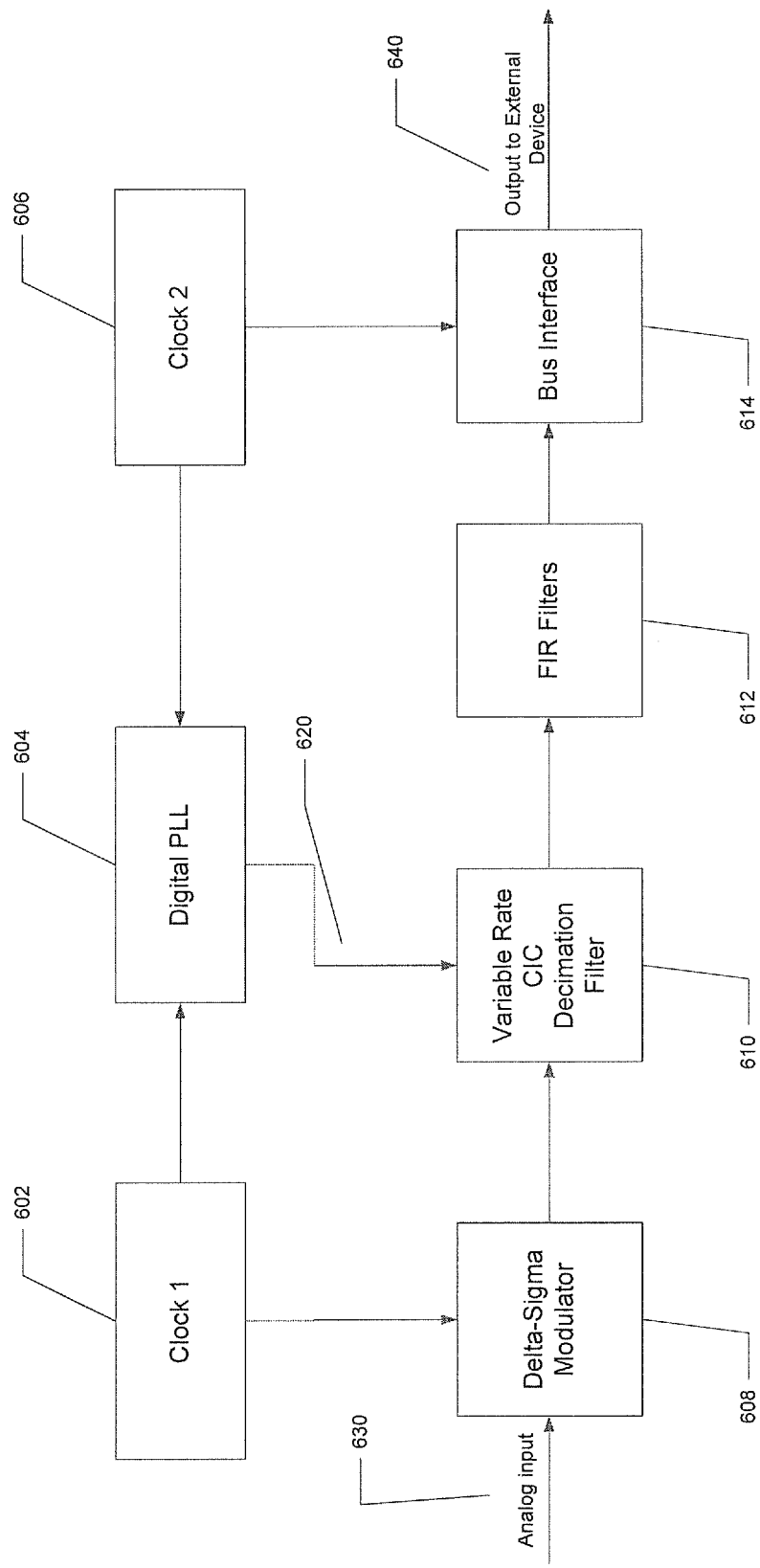
FIG. 6 is a block diagram of a particular embodiment of an analog to digital converter incorporating a variable rate digital decimation filter, such as the digital decimation filter of FIG. 2.

Referring to FIG. 6, an analog to digital converter system incorporating a variable rate digital decimation filter is illustrated. The system includes a first clock 602, a digital phase lock loop 604, and a second clock 606. The system further includes a delta sigma modulator 608, a variable rate CIC decimation filter 610, a finite impulse response (FIR) filter stage 612, and a bus interface 614. The delta sigma modulator receives an analog input 630. The bus interface module 614 provides an output to an external device 640.

The delta sigma modulator 608 is controlled by the first clock 602 and the bus interface 614 is controlled by the second clock 606. The digital phase lock loop 604 measures a difference between the rate of the first clock 602 and a rate of the second clock 606. Based on this measured difference, the digital phase lock loop may provide a control signal 620 to the variable rate CIC decimation filter 610. The variable rate CIC decimation filter 610 is responsive to an output of the delta sigma modulator 608. The FIR filters 612 are responsive to an output of the variable rate CIC decimation filter 610. An output of the FIR filters 612 is received by the bus interface 614.

During operation, the digital phase lock loop 604 measures a difference in the clock rate of the first clock 602 and the clock rate of the second clock 606. In a particular embodiment, the first clock 602 is an on-chip clock and the second clock 606 is based on an external clock. The clock rates of the first clock 602 and the second clock 606 may vary independently over time, depending on the temperature of each clock and other operating conditions. Because the clock rates of the first clock 602 and the second clock 606 may vary independently of each other, the difference measured by the phase lock loop 604 may change over time.

Based on the measured difference in the clock rate of the first clock 602 and the clock rate of the second clock 606, the digital phase lock loop 604 provides a control signal 620 to the variable rate CIC decimation filter 610. In a particular embodiment the control signal 620 is a decimation rate adjustment signal. Based on the control signal 620, the decimation rate of the variable rate CIC decimation filter 610 is adjusted. In a particular embodiment, the decimation rate of the variable rate CIC decimation filter 610 includes a non-integer portion, to allow decimation by a non-integer rate.

The delta sigma modulator receives the analog input 630. The analog input 630 is converted into a digital format, filtered, and decimated according to the rate of the variable rate CIC decimation filter 610. As the control signal 620 changes over time (based on the change in the measured difference between the rates of the clocks 602 and 606) the decimation rate of variable rate CIC decimation filter is also changed. This allows the variable rate CIC decimation filter to adapt to the changing rates of the clocks 602 and 606.

Figure 7:
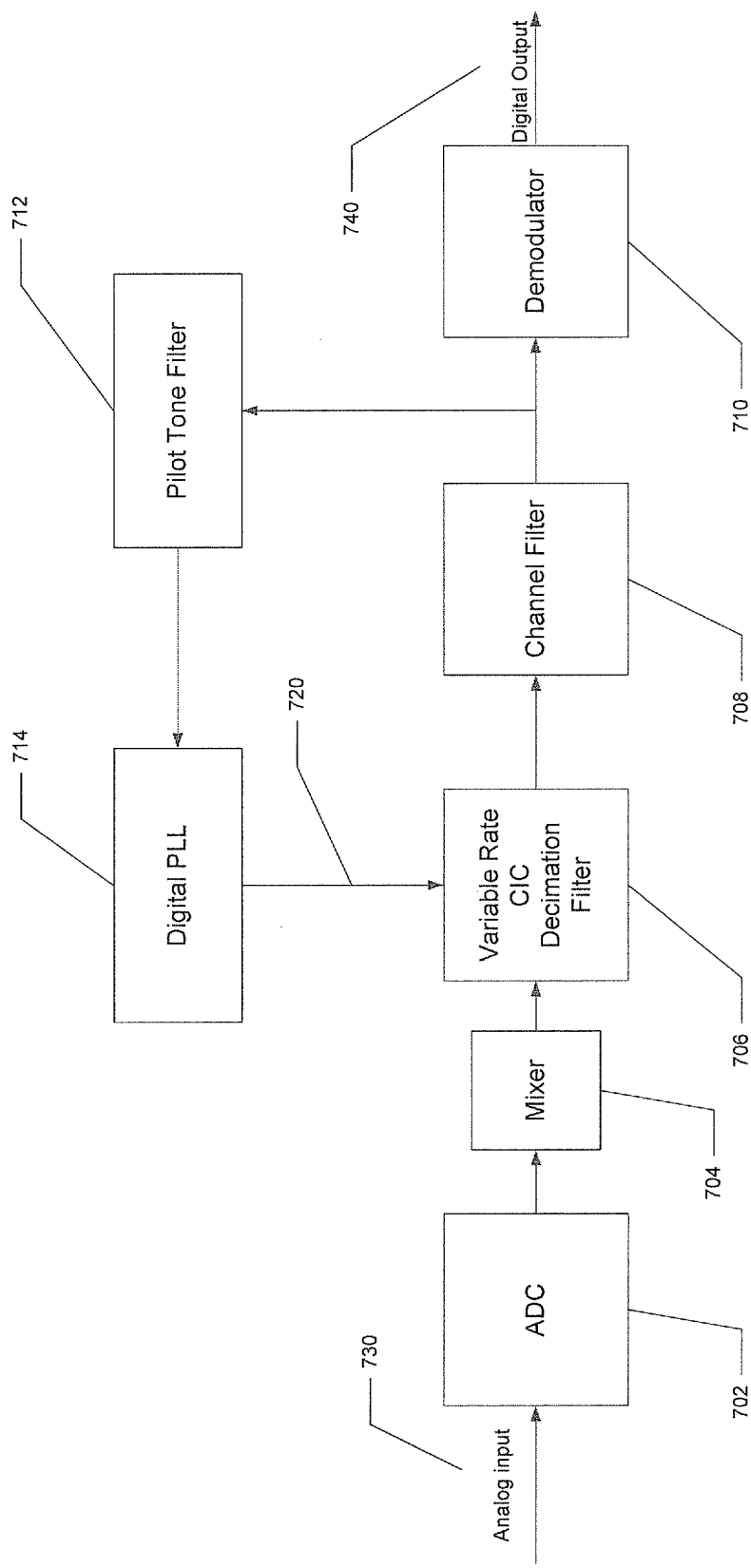
FIG. 7 is a block diagram of an exemplary embodiment of a receiver circuit incorporating a variable rate digital decimation filter, such as the digital decimation filter of FIG. 2.

Referring to FIG. 7, a system for processing an analog signal is illustrated. The system includes an analog to digital converter 702, a mixer 704, a variable rate CIC decimation filter 706, and a channel filter 708. The system also includes a demodulator 710, a pilot tone filter 712, and a digital phase lock loop 714.

The analog to digital converter 702 receives an analog input 730. The mixer 704 is responsive to an output to the analog to digital converter 702. The variable rate CIC decimation filter 706 is responsive to an output of the mixer 704. The decimation rate of the variable rate CIC decimation filter is controlled by a control signal 720 provided by the digital phase lock loop 714. The channel filter 708 is responsive to an output of the variable rate CIC decimation filter 706. The pilot tone filter 712 is responsive to an output of the channel filter 708. The demodulator 710 is also responsive to the output of the channel filter 708. The demodulator 710 provides a digital output 740. The digital phase lock loop 714 is responsive to an output of the pilot tone filter 712.

During operation, the digital phase lock loop 714 measures the rate of the output of the pilot tone filter 712. The rate may change over time, based on changes in the analog input 730.

Based on the measured rate, the digital phase lock loop provides a control signal 720 to the variable rate CIC decimation filter 706. In a particular embodiment, this control signal 720 is a decimation rate adjustment signal. The decimation rate of the variable rate CIC decimation filter 706 is thereby adjusted based on the measured rate of the output of the pilot tone filter 712. In another particular embodiment, the digital phase lock loop 714 incrementally adjusts the decimation rate of the variable rate CIC decimation filter 706 until a target rate is reached. Thus, as the measured rate of the output of the pilot tone filter 712 changes over time, the decimation rate of the variable rate CIC decimation filter is adapted. This can permit improved processing of the analog signal 730.

The above disclosed subject matter is to be considered illustrative, and not restrictive, and the appended claims are intended to cover all such modifications, enhancements, and other embodiments which fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A system comprising:
   a decimation module having an adjustable decimation rate;
   a filter module responsive to the decimation module;
   a digital phase lock loop configured to control the adjustable decimation rate of the decimation module; and
   a pilot tone filter responsive to the filter module, wherein the digital phase lock loop is responsive to the pilot tone filter, wherein the decimation module is a cascade integrator comb decimation module, and wherein the digital phase lock loop is further configured to measure a rate of an output of the pilot tone filter and to adjust the decimation rate based on the rate of the output of the pilot tone filter.

2. The system of claim 1, further comprising:
   an analog to digital converter to receive an analog input signal;
   a mixer responsive to the analog to digital converter, wherein the decimation module is responsive to the mixer; and
   a demodulator responsive to the filter module.

3. The system of claim 2, wherein the digital phase lock loop is further configured to incrementally adjust the adjustable decimation rate of the decimation module until a target rate is reached.

4. The system of claim 1, wherein the adjustable decimation rate includes a non-integer portion.

5. The system of claim 1, wherein the digital phase lock loop is configured to control the adjustable decimation rate of the decimation module via an adjustable rate decimation signal, wherein the decimation module includes an output adjustment module, a variable rate down sampling module, and an adder, wherein the output adjustment module is configured to add an adjustment factor to an output of the variable rate down sampling module, and wherein the adjustment factor is based on a change in the adjustable rate decimation signal multiplied by an output of the adder.

6. A method comprising:
   receiving, at a cascade integrator comb (CIC) decimation filter, a control signal from a digital phase lock loop (PLL), wherein the control signal is responsive to a pilot tone filter;
   in response to the control signal, adjusting a decimation rate of the CIC decimation filter;
   decimating a digital signal based on the decimation rate of the CIC decimation filter to create a decimated digital signal, wherein the digital loop is further configured to measure a rate of an output of the pilot tone filter and to adjust the decimation rate based on the rate of the output of the pilot tone filter; and
   providing the decimated digital signal to a filter module.

7. The method of claim 6, wherein the filter module comprises a plurality of finite impulse response (FIR) filters, and further comprising filtering the decimated digital signal by the plurality of FIR filters.

8. The method of claim 6, wherein the decimation rate is a non-integer rate.

9. The method of claim 6, wherein the CIC decimation filter includes a variable rate down sampling module and an adder, and further comprising adding an adjustment factor to an output of the variable rate down sampling module, wherein the adjustment factor is based on a change in the control signal multiplied by an output of the adder.

10. An apparatus comprising:
    means for decimating digital signals, wherein the means for decimating includes a cascade integrator comb (CIC) decimation filter;
    means for filtering digital signals, wherein the means for filtering is coupled to the means for decimating;
    a digital phase lock loop (PLL), wherein the digital PLL is configured to control a decimation rate of the CIC decimation filter; and
    a pilot tone filter configured to provide an output to the digital PLL, wherein the digital PLL is configured to measure an output rate of the pilot tone filter and to alter a control signal in response to determining a change in the output rate.

11. The apparatus of claim 10, wherein the CIC decimation filter includes an output adjustment module, a variable rate down sampling module, and an adder, wherein the output adjustment module is configured to add an adjustment factor to an output of the variable rate down sampling module, and wherein the adjustment factor is based on a change in the control signal multiplied by an output of the adder.

* * * * *